United States Patent
Liao et al.

(10) Patent No.: US 9,311,991 B2
(45) Date of Patent: Apr. 12, 2016

(54) SOLID STATE DRIVE WITH HYBRID STORAGE MODE

(71) Applicant: Apacer Technology Inc., New Taipei (TW)

(72) Inventors: Yin-Chuan Liao, New Taipei (TW); Hung-Wen Pan, New Taipei (TW)

(73) Assignee: Apacer Technology Inc., New Taipei (TW)

( * ) Notice: Subject to any disclaimer, the term of this patent is extended or adjusted under 35 U.S.C. 154(b) by 0 days.

(21) Appl. No.: 14/468,723

(22) Filed: Aug. 26, 2014

(65) Prior Publication Data

US 2016/0064071 A1 Mar. 3, 2016

(51) Int. Cl.
*G11C 16/04* (2006.01)
*G11C 11/56* (2006.01)
*G11C 16/10* (2006.01)
*G11C 13/00* (2006.01)

(52) U.S. Cl.
CPC .......... *G11C 11/5628* (2013.01); *G11C 13/004* (2013.01); *G11C 16/0483* (2013.01); *G11C 16/10* (2013.01); *G11C 2211/5641* (2013.01)

(58) Field of Classification Search
CPC ................... G11C 2211/5641; G11C 11/5628; G11C 11/5678; G11C 11/5641; G11C 13/00; G11C 13/0004
USPC .......... 365/185.17, 185.23, 227, 228, 185.08; 711/103
See application file for complete search history.

(56) References Cited

U.S. PATENT DOCUMENTS

| 8,078,994 | B2 * | 12/2011 | Kanai | G06F 17/5068 716/111 |
| 8,452,912 | B2 * | 5/2013 | Lee | G06F 12/0246 710/54 |
| 2009/0193184 | A1 * | 7/2009 | Yu | G06F 12/0246 711/103 |
| 2010/0146194 | A1 * | 6/2010 | Cheng | G06F 12/0246 711/103 |
| 2013/0254458 | A1 * | 9/2013 | Pittelko | G06F 12/02 711/103 |

FOREIGN PATENT DOCUMENTS

TW    I385517    2/2013

* cited by examiner

*Primary Examiner* — Gene Auduong
(74) *Attorney, Agent, or Firm* — Muncy, Geissler, Olds & Lowe, P.C.

(57) ABSTRACT

A solid state drive (SSD) with a hybrid storage mode includes a flash memory, and a data processing module in information communication with the flash memory. The flash memory includes a first storage sector that stores data by a first potential storage mode, and a second storage sector that stores data by a second potential storage mode. The first storage sector corresponds to physical block addresses $P_0$ to $P_{M-1}$ and logical block addresses $L_0$ to $L_{M-1}$. The second storage sector corresponds to physical block addresses $P_M$ to $P_{M+N-1}$ and logical block addresses $L_M$ to $L_{M+1-1}$. The data processing module has a data processing mode. In the data processing mode, the data processing module identifies the logical block address included in a command, and executes the command at the corresponding physical block address. Accordingly, an SSD having a high stability and a high data storage capacity is provided.

10 Claims, 3 Drawing Sheets

SOLID STATE DRIVE WITH HYBRID STORAGE MODE

FIELD OF THE INVENTION

The present invention relates to a solid state drive (SSD), and particularly to an SSD with a hybrid storage mode by using a same flash memory.

BACKGROUND OF THE INVENTION

As the solid state drive (SSD) technologies have matured, SSDs are gradually used to replace conventional hard disk drives (HDDs). Compared to a conventional SSD, the HDD features advantages of a fast response speed in data access, low power consumption and a light weight.

The SSD primarily utilizes a floating gate transistor of a flash memory to store bit data. The number of bits that each transistor can store is categorized into two potential storage modes—a single-level cell (SLC) mode, and a multi-level cell (MLC) mode. When applying the SLC mode, the potential only changes between two voltages. That is, each transistor stores only one bit of data. When applying the MLC mode, each transistor stores two to three bits of data. Thus, when applying the MLC mode, the number of bits of data stored in each transistor is several times of that when applying the SLC mode. Further, flash memories that implement the MLC mode are quite low in cost. However, applications based on the MLC mode have a lower response speed in data access and also a shorter life cycle. In contrast, although flash memories based on the SLC mode are more stable and have a faster response speed in data access and a longer life cycle, they suffer from a lower data storage density and higher production costs.

Therefore, many manufacturers have proposed hybrid SSDs that includes both the SLC potential storage mode and the MLC potential storage mode. For example, the Taiwan Patent No. I385517 discloses a storage device that achieves hybrid storage by using a first flash memory and a second flash memory different from the first flash memory. However, as the above disclosure involves two different types of flash memories, the production costs of the above disclosure remain limited to costs of flash memories based on the SLC potential storage mode and cannot be effectively reduced.

SUMMARY OF THE INVENTION

The primary object of the present invention is to solve issues regarding the data stability and data storage capacity caused by a single potential storage mode of a conventional SSD.

To achieve the above object, a solid state drive (SSD) with a hybrid storage mode is provided. The SSD includes a flash memory and a data processing module. The flash memory includes a first storage sector that stores data by a first potential storage mode, and a second storage sector that stores data by a second potential storage mode different from the first potential storage mode. The first storage sector includes M data blocks. The second storage sector includes N data blocks. Each of the data blocks corresponds to a physical block address and a logical block address. The first storage sector corresponds to physical block addresses $P_0$ to $P_{M-1}$ and logical block addresses $L_0$ to $L_{M-1}$. The second storage sector corresponds to physical block addresses $P_M$ to $P_{M+N-1}$ and logical block addresses $L_M$ to $L_{M+N-1}$. The data processing module, in data communication with the flash memory, has a data processing mode. In the data processing mode, the data processing module receives a command, identifies the logical block address included in the command, and executes the command at the corresponding physical block address.

In one embodiment, the first potential storage mode is a single-cell level (SCL) mode, and the second potential storage mode is a multi-cell level (MCL) mode. Further, the data processing module has a data modulation mode. In the data modulation mode, when the logical block address included in the command is identified as $L_0$ to $L_{M-1}$, a potential modulation command is added to the command to change the original potential storage mode of the command.

In one embodiment, the first potential storage mode is an MLC mode, and the second potential storage mode is an SLC mode. Further, the data processing module has a data modulation mode. In the data modulation mode, when the logical block address included in the command is identified as $L_M$ to $L_{M+N-1}$, a potential modulation command is added to the command to change the original potential storage mode of the command.

In one embodiment, the data processing module includes a first mapping table and a second mapping table. The first mapping table records the physical block addresses $P_0$ to $P_{M-1}$ and the logical block addresses $L_0$ to $L_{M-1}$ corresponding to the first storage sector. The second mapping table records the physical block addresses $P_M$ to $P_{M+N-1}$ and the logical block addresses $L_M$ to $L_{M+N-1}$ corresponding to the second storage sector.

In one embodiment, the flash memory further includes a third storage sector. The third storage sector has a third potential storage mode different from the first potential storage mode and the second potential storage mode. The third sector includes R data blocks, and corresponds to physical block addresses $P_N$ to $P_{N+R-1}$ and logical block addresses $L_N$ to $L_{N+R-1}$. Further, the data processing module includes a first mapping table, a second mapping table and a third mapping table. The first mapping table records the physical block addresses $P_0$ to $P_{M-1}$ and the logical block addresses $L_0$ to $L_{M-1}$ corresponding to the first storage sector. The second mapping table records the physical block addresses $P_M$ to $P_{M+N-1}$ and the logical block addresses $L_M$ to $L_{M+N-1}$ corresponding to the second storage sector. The third mapping table records the physical block addresses $P_N$ to $P_{N+R-1}$ and logical block addresses $L_N$ to $L_{N+R-1}$ corresponding to the third storage sector.

In one embodiment, the data processing module has an average writing algorithm. When the command is a data write operation, the average writing algorithm identifies an available block for average writing according to an erase count of each of the data blocks of the first storage sector and the second storage sector.

With the implementation set forth by the above description, compared to the prior art, the present invention offers the features below. In the present invention, a flash memory based on the same transistor type is applied. The flash memory is divided into a first storage sector and a second storage sector, and the potential storage modes used by the first storage sector and the second storage sector are rendered to be different, thereby providing an SSD with a high stability and a high data storage capacity.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENTS

Figure 1:
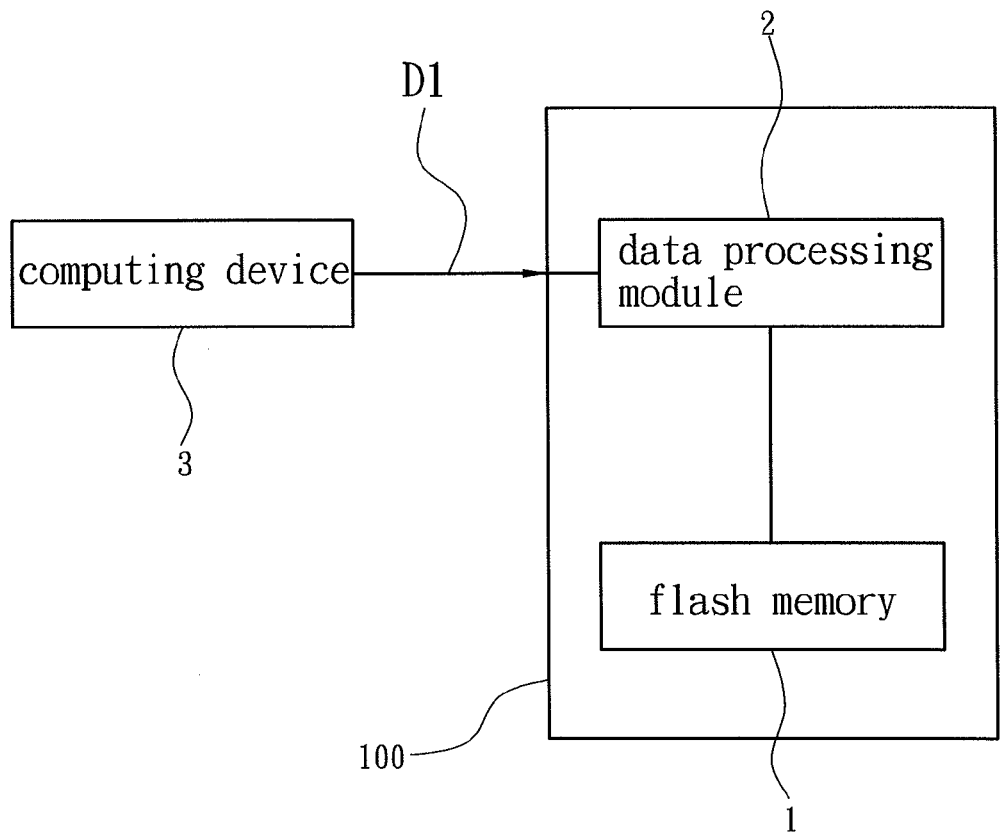
FIG. 1 is a schematic diagram of an SSD with a hybrid storage mode according to an embodiment of the present invention.
Figure 2:
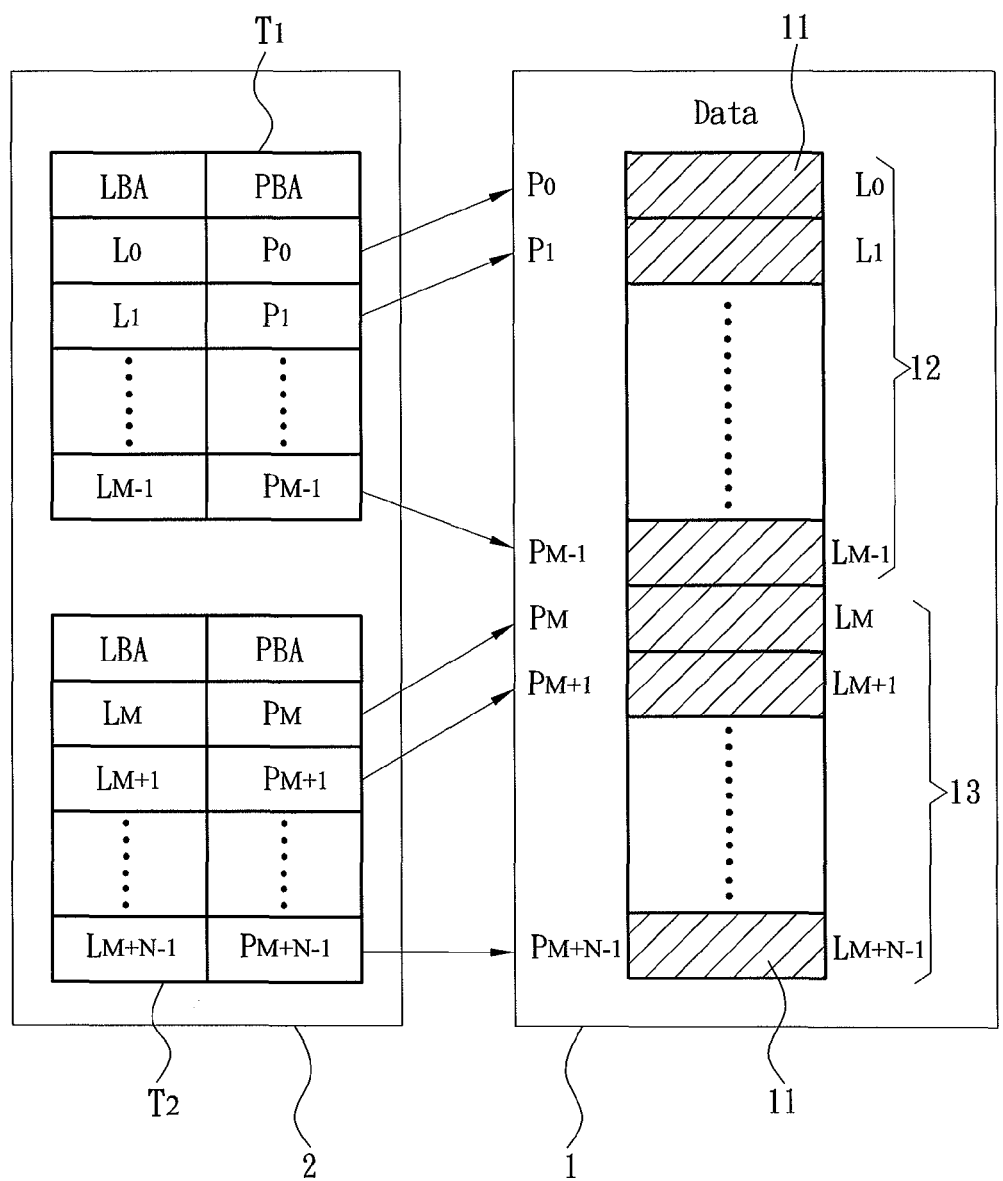
FIG. 2 is a schematic diagram of a flash memory in an SSD with a hybrid storage mode according to an embodiment of the present invention.

Referring to FIG. 1 and FIG. 2, a solid state drive (SSD) 100 with a hybrid storage mode of the present invention includes a flash memory 1, and a data processing module 2 in information communication with the flash memory 1. The flash memory 1 of the present invention may be formed by a plurality of chips that are based on the same transistor type. In other words, before implementing the flash memory 1 of the present invention, only one potential storage mode, e.g., a multi-level cell (MLC) mode, is available. The flash memory 1 includes a plurality of data blocks 11, each of which corresponds to a physical block address and a logical block address. Further, the flash memory 1 of the present invention is divided into a first storage sector 12 and a second storage sector 13. The first storage sector 12 includes M data blocks 11, which correspond to physical block addresses $P_0$ to $P_{M-1}$ and logical block addresses $L_0$ to $L_{M-1}$. The second storage sector 13 includes N data blocks 11, which correspond to physical block address $P_M$ to $P_{M+N-1}$ and logical block addresses $L_M$ to $L_{M+N-1}$.

As previously stated, before implementing the flash memory 1 of the present invention, only one potential storage mode is available. During the implementation of the present invention, the potential storage mode of one of the storage sectors is changed by the data processing module 2 to simulate another potential storage mode to record data. More specifically, in the present invention, the first storage sector 12 stores data by a first potential storage mode, and the second storage sector 13 stores data by a second potential storage mode different from the first potential storage mode. In one exemplary embodiment, the first potential storage mode is a single-level cell (SLC) mode, and the second potential storage mode is the MLC mode. As previously described, the flash memory 1 of the present invention is divided into the first storage sector 12 and the second storage sector 13. Since the potential storage mode of the first storage sector 12 is different from that of the second storage sector 13, a data storage capacity of the first storage sector 12 is different from that of the second storage sector 13. For example, when the first potential storage mode of the first storage sector 12 is the SLC mode, each transistor in each data block 11 in the first storage sector 12 stores only one bit of data. Thus, the data storage capacity of the first storage sector 12 is smaller than that of the second storage sector 13 based on the MLC mode having the second potential storage mode.

In the present invention, the data processing module 2 is in information communication with the flash memory 1, and has a data processing mode. In the data processing mode, the data processing module 2 receives a command D1, identifies the logical block address included in the command D1, and executes the command D1 at the corresponding physical block address. More specifically, the SSD 100 of the present invention may be connected to a computing device 3 (e.g., a computer), which is caused to write or read data from the SSD device 100. In the present invention, the command D1 is issued by the computing device. When the computing device 3 issues the command D1 to the SSD 100, the data processing module 2 receives the command D1. Next, the data processing module 2 identifies the logical block address of data corresponding to an operation to be executed, and accesses the corresponding data according to the logical block address. Further, as previously described, the first potential storage mode may be implemented by the MLC mode. Therefore, the data processing module 2 may further have a data modulation mode. In the data modulation mode, when it is identified that the logical block address included in the command D1 is $L_0$ to $L_{M-1}$, a potential modulation command is added to the command D1 to change the original storage mode of the command D1. Further, in one embodiment of the present invention, when the second potential storage mode is implemented by the MLC mode, the data modulation mode of the data processing module 2 is implemented when the logical block address included in the command D1 is $L_M$ to $L_{M+N-1}$. As such, with the data modulation mode of the data processing module 2, the present invention simulates the original MLC potential storage mode to the SLC potential storage. Further, the potential modulation command may be a flag command or a paging command.

Again referring to FIG. 2, the data processing module 2 of the present invention further includes a first mapping table T1 and a second mapping table T2. The first mapping table T1 records the physical block addresses $P_0$ to $P_{M-1}$ and the logical block addresses $L_0$ to $L_{M-1}$ corresponding to the first storage sector 12. The second mapping table T2 records the physical block addresses $P_M$ to $P_{M+N-1}$ and the logical block addresses $L_M$ to $L_{M+N-1}$ corresponding to the second storage sector 13. Thus, the data processing module 2 is capable of quickly mapping each logical block address to each physical block address through the first mapping table T1 and the second mapping table T2. The data processing module 2 further has an average writing algorithm. When the command D1 is a data write operation, the average writing algorithm identifies an available block for average writing according to an erase count of each of the data block 11 of the first storage sector 12 and the second storage sector 13.

Figure 3:
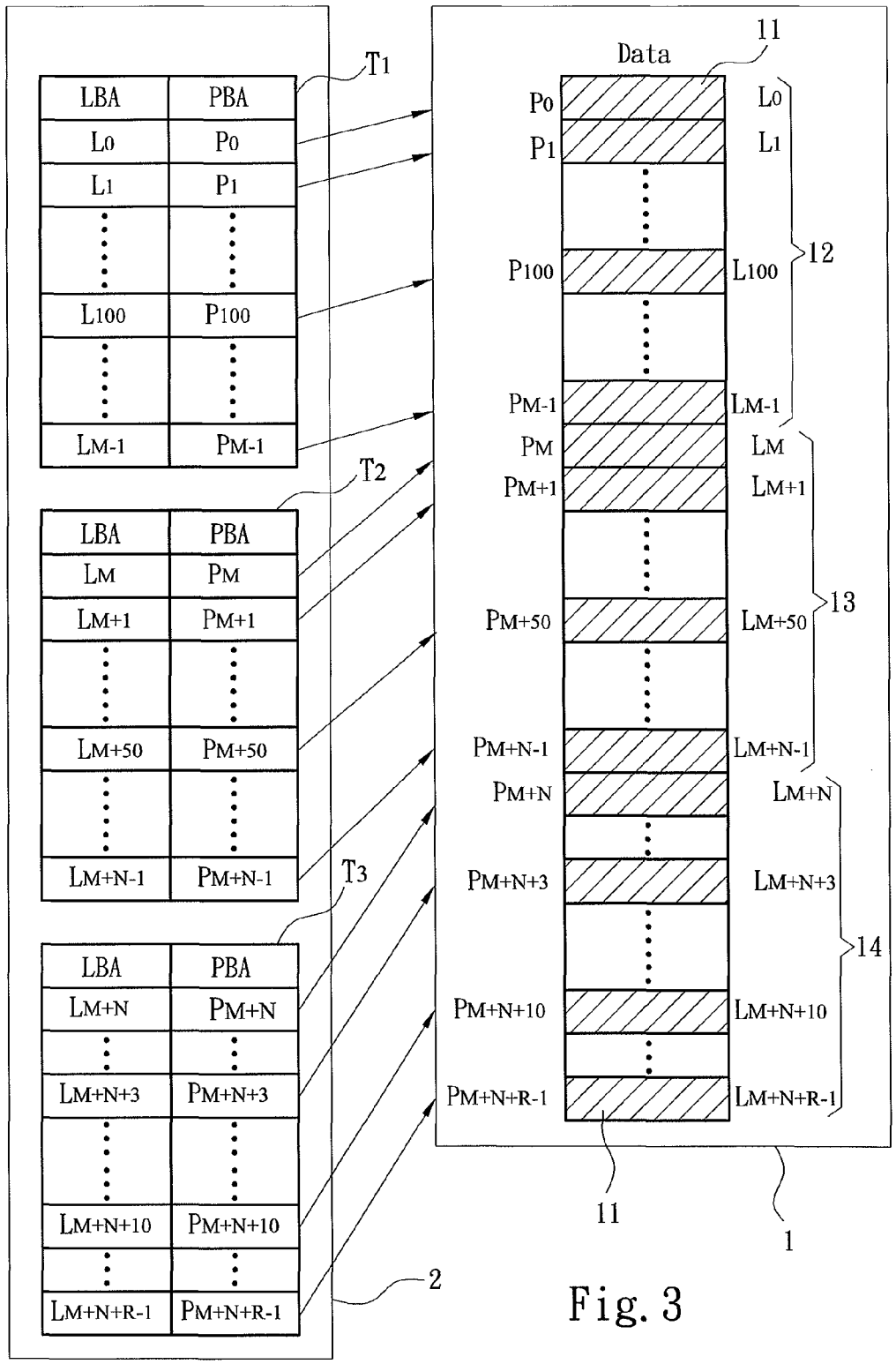
FIG. 3 is a schematic diagram of a flash memory in an SSD with a hybrid storage mode according to another embodiment of the present invention.

Referring to FIG. 3, in one embodiment of the present invention, in addition to the first storage sector 12 and the second storage sector 13, the flash memory 2 further includes a third storage sector 14. The third storage sector 14 has a third potential storage mode for storing data. The third potential storage mode is different from the first potential storage mode and the second potential storage mode. Further, the third storage sector 14 includes R data blocks 11, and corresponds to physical block addresses $P_N$ to $P_{N+1-1}$ and logical block addresses $L_N$ to $L_{N+R-1}$. For example, in the embodiment, the first potential storage mode is the SLC mode, the second potential storage mode is the MLC mode, and the third potential storage mode is a triple-layer cell (TLC) mode. In the embodiment, in addition to the first mapping table T1 and the second mapping table T2, the data processing module 2 further includes a third mapping table T3. The third mapping table T3 records the physical block addresses $P_N$ to $P_{N+R-1}$ and the logical block addresses $L_N$ to $L_{N+R-1}$ corresponding to the third storage sector 14.

In conclusion, the SSD with a hybrid storage mode of the present invention includes a flash memory and a data processing module in information communication with the flash memory. The flash memory includes a first storage sector that stores data by a first potential storage mode, and a second storage sector that stores data by a second potential storage mode. The first storage sector corresponds to physical block addresses $P_0$ to $P_{M-1}$ and logical block addresses $L_0$ to $L_{M-1}$. The second storage sector corresponds to physical block addresses $P_M$ to $P_{M+N-1}$ and logical block addresses $L_M$ to $L_{M+N-1}$. The data processing module has a data processing mode. In the data processing mode, the data processing module identifies the logical block address included in a command and executes a command operation at the corresponding physical block address. Accordingly, an SSD having a high stability and a high data storage capacity is provided.

What is claimed is:

1. A solid state drive (SSD) with a hybrid storage mode, comprising:
    a flash memory, comprising a first storage sector that stores data by a first potential storage mode and a second storage sector that stores data by a second potential storage mode different from the first potential storage mode, the first storage sector comprising M data blocks, the second storage sector comprising N data blocks, each of the data blocks corresponding to a physical block address and a logical block address, the first storage sector corresponding to physical block addresses $P_0$ to $P_{M-1}$ and logical block addresses $L_0$ to $L_{M-1}$, the second storage sector corresponding to physical block addresses $P_M$ to $P_{M+N-1}$ and logical block addresses $L_M$ to $L_{M+N-1}$; and
    a data processing module, being in information communication with the flash memory, having a data processing mode in which the data processing module receives a command, identifies the logical block address included in the command, and executes the command at the corresponding physical block address;
    wherein the data processing module further has a data modulation mode in which a potential modulation command is added to the command to change the original potential storage mode of the command.

2. The solid state drive (SSD) with a hybrid storage mode of claim 1, wherein the first potential storage mode is a single-layer cell (SLC) mode and the second potential storage mode is a multi-layer cell (MLC) mode.

3. The solid state drive (SSD) with a hybrid storage mode of claim 2, wherein the potential modulation command is added to the command to change the original potential storage mode of the command when the logical block address included in the command is identified as $L_0$ to $L_{M-1}$.

4. The solid state drive (SSD) with a hybrid storage mode of claim 1, wherein the first potential storage mode is a multi-layer cell (MLC) mode and the second potential storage mode is a single-layer cell (SLC) mode.

5. The solid state drive (SSD) with a hybrid storage mode of claim 4, wherein the potential modulation command is added to the command to change the original potential storage mode of the command when the logical block address included in the command is identified as $L_M$ to $L_{M+N-1}$.

6. The solid state drive (SSD) with a hybrid storage mode of claim 1, wherein a data storage capacity of the first storage sector is different from that of the second storage sector.

7. The solid state drive (SSD) with a hybrid storage mode of claim 1, wherein the data processing module includes a first mapping table and a second mapping table, the first mapping table recording the physical block addresses $P_0$ to $P_{M-1}$ and the logical block addresses $L_0$ to $L_{M-1}$ corresponding to the first storage sector, and the second mapping table recording the physical block addresses $P_M$ to $P_{M+N-1}$ and the logical block addresses $L_M$ to $L_{M+N-1}$ corresponding to the second storage sector.

8. The solid state drive (SSD) with a hybrid storage mode of claim 1, wherein the flash memory further comprises a third storage sector that stores data by a third potential storage mode different from the first potential storage mode and the second potential storage mode, and the third storage sector comprises R data blocks and corresponds to physical block addresses $P_N$ to $P_{N+R-1}$ and logical block addresses $L_N$ to $L_{N+R-1}$.

9. The solid state drive (SSD) with a hybrid storage mode of claim 8, wherein the data processing module includes a first mapping table, a second mapping table and a third mapping table, the first mapping table recording the physical block addresses $P_0$ to $P_{M-1}$ and the logical block addresses $L_0$ to $L_{M-1}$ corresponding to the first storage sector, the second mapping table recording the physical block addresses $P_M$ to $P_{M+N-1}$ and the logical block addresses $L_M$ to $L_{M+N-1}$ corresponding to the second storage sector, and the third mapping table recording the physical block addresses $P_N$ to $P_{N+R-1}$ and the logical block addresses $L_N$ to $L_{N+R-1}$ corresponding to the third storage sector.

10. The solid state drive (SSD) with a hybrid storage mode of claim 1, wherein the data processing module has an average writing algorithm to identify an available block for average writing according to an erase count of each of the data blocks of the first storage sector and the second storage sector when the command is for a writing operation.

* * * * *